US009530917B2

(12) United States Patent
Horie et al.

(10) Patent No.: US 9,530,917 B2
(45) Date of Patent: Dec. 27, 2016

(54) POLYESTER FILM, SOLAR CELL BACKSHEET, AND SOLAR CELL

(71) Applicant: TORAY Industries, Inc., Tokyo (JP)

(72) Inventors: Masato Horie, Otsu (JP); Tadamasa Suzuki, Otsu (JP); Tomohide Masuda, Otsu (JP); Kozo Takahashi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 232 days.

(21) Appl. No.: 14/360,484

(22) PCT Filed: Nov. 19, 2012

(86) PCT No.: PCT/JP2012/079972
§ 371 (c)(1),
(2) Date: May 23, 2014

(87) PCT Pub. No.: WO2013/080827
PCT Pub. Date: Jun. 6, 2013

(65) Prior Publication Data
US 2014/0352776 A1 Dec. 4, 2014

(30) Foreign Application Priority Data
Dec. 2, 2011 (JP) ................. 2011-264500

(51) Int. Cl.
H01L 31/048 (2014.01)
H01L 31/049 (2014.01)
B32B 27/36 (2006.01)
B32B 27/20 (2006.01)
C08L 67/02 (2006.01)
C08L 67/03 (2006.01)
C08K 3/22 (2006.01)
C08K 3/34 (2006.01)
C08J 5/18 (2006.01)
C08K 3/00 (2006.01)

(52) U.S. Cl.
CPC ............ *H01L 31/049* (2014.12); *B32B 27/20* (2013.01); *B32B 27/36* (2013.01); *C08J 5/18* (2013.01); *C08K 3/22* (2013.01); *C08K 3/34* (2013.01); *C08L 67/02* (2013.01); *C08L 67/03* (2013.01); *H01L 31/048* (2013.01); *B32B 2307/538* (2013.01); *B32B 2367/00* (2013.01); *B32B 2457/12* (2013.01); *C08K 3/0033* (2013.01); *C08K 2003/2227* (2013.01); *Y02E 10/50* (2013.01); *Y10T 428/2443* (2015.01); *Y10T 428/24355* (2015.01); *Y10T 428/24405* (2015.01); *Y10T 428/24413* (2015.01); *Y10T 428/24421* (2015.01); *Y10T 428/254* (2015.01); *Y10T 428/256* (2015.01); *Y10T 428/259* (2015.01); *Y10T 428/31786* (2015.04)

(58) Field of Classification Search
None
See application file for complete search history.

(56) References Cited

U.S. PATENT DOCUMENTS

| 5,051,292 A * | 9/1991 | Katoh | G11B 5/7305 428/141 |
| 5,252,388 A * | 10/1993 | Murooka | G11B 5/733 428/328 |
| 5,393,716 A * | 2/1995 | Light | C04B 14/106 106/416 |
| 5,731,071 A * | 3/1998 | Etchu | B29C 55/12 174/110 SR |
| 5,858,507 A * | 1/1999 | Yoshida | B29C 55/065 264/288.4 |
| 5,961,943 A * | 10/1999 | Komatsu | C01B 39/46 423/328.2 |
| 6,783,889 B2 * | 8/2004 | Kubota | B32B 27/36 427/128 |
| 8,658,285 B2 * | 2/2014 | Hinton | B29C 55/065 264/165 |
| 2001/0055674 A1 * | 12/2001 | Hellman | B32B 27/36 428/216 |
| 2002/0114977 A1 * | 8/2002 | Kubota | B32B 27/36 428/844.5 |
| 2003/0148068 A1 * | 8/2003 | Okumura | B32B 27/36 428/141 |
| 2004/0028925 A1 * | 2/2004 | Kusume | B29C 55/12 428/480 |
| 2005/0238871 A1 * | 10/2005 | Robinson | C08J 7/047 428/331 |
| 2008/0193747 A1 * | 8/2008 | MacDonald | B29C 55/04 428/336 |
| 2009/0275678 A1 * | 11/2009 | Kumazawa | C08L 67/00 523/523 |
| 2010/0000603 A1 * | 1/2010 | Tsuzuki | B32B 17/10018 136/259 |
| 2010/0215902 A1 * | 8/2010 | Kiehne | B32B 17/10018 428/141 |
| 2010/0285302 A1 * | 11/2010 | Yoshida | B32B 27/08 428/317.9 |
| 2011/0100454 A1 * | 5/2011 | Adam | B29C 55/04 136/256 |
| 2011/0209901 A1 * | 9/2011 | MacDonald | C08J 7/04 174/254 |

(Continued)

FOREIGN PATENT DOCUMENTS

JP 2-307788 A 12/1990
JP 2008-305822 A 12/2008
(Continued)

OTHER PUBLICATIONS

English machine translation of JP-2011-212857-A.
(Continued)

*Primary Examiner* — Vivian Chen
(74) *Attorney, Agent, or Firm* — Birch, Stewart, Kolasch & Birch, LLP

(57) ABSTRACT

An object of the present invention is to provide a polyester film whose wet heat resistance is not reduced even when incorporated into a solar cell backsheet or solar cell. The polyester film according to the present invention has a peak count $SPc\_L$ (400 nm) of 100 to 700 and a peak count $SPc\_H$ (4,000 nm) of not more than 10 on at least one surface, the polyester film having an amount of terminal carboxyl groups of 0 to 20 eq/ton.

5 Claims, No Drawings

(56) References Cited

U.S. PATENT DOCUMENTS

| | | | |
|---|---|---|---|
| 2011/0214720 A1* | 9/2011 | Hashimoto | B29C 47/00 |
| | | | 136/252 |
| 2011/0219747 A1* | 9/2011 | Geveci | F01N 3/208 |
| | | | 60/274 |
| 2012/0014977 A1* | 1/2012 | Furihata | C07K 14/4748 |
| | | | 424/185.1 |
| 2012/0080089 A1* | 4/2012 | Aoyama | C08J 5/18 |
| | | | 136/256 |
| 2012/0208943 A1 | 8/2012 | Kojima et al. | |

FOREIGN PATENT DOCUMENTS

| | | | |
|---|---|---|---|
| JP | 2010-169869 A | | 8/2010 |
| JP | 2010-175620 A | | 8/2010 |
| JP | 2011-212857 | * | 10/2011 |
| JP | 2011-212857 A | | 10/2011 |
| WO | WO 2011/052290 A1 | | 5/2001 |
| WO | WO 2010/131643 | * | 11/2010 |
| WO | WO 2010/140611 | * | 12/2010 |

OTHER PUBLICATIONS

Tawainese Office Action and Search Report dated Feb. 11, 2015, for Taiwanese Application No. 101144458 with the English translation.
Japanese Office Action and English translation thereof, dated Apr. 11, 2013, for Japanese Application No. 2013-506035.
International Search Report issued in PCT/JP2012/079972 mailed Feb. 12, 2013.
Written Opinion of the International Searching Authority issued in PCT/JP2012/079972 mailed Feb. 12, 2013.

* cited by examiner

POLYESTER FILM, SOLAR CELL BACKSHEET, AND SOLAR CELL

TECHNICAL FIELD

The present invention relates to a polyester film having excellent durability. The present invention also relates to a solar cell backsheet and solar cell which comprise the polyester film.

BACKGROUND ART

Polyester films have been used in various applications, such as materials of magnetic recording media, electrical insulators, solar cells, capacitors and packagings and industrial materials, by taking advantage of their characteristics such as excellent mechanical, thermal and surface properties as well as excellent heat resistance. In recent years, among these applications, the demand for solar cells that generate clean energy as semi-permanent and pollution-free next-generation energy source has increased, and polyester films have been used as a member constituting a solar cell backsheet (Patent Documents 1 and 2). In addition, as a way of extending the service live of solar cells, there is an increasing demand for an improvement in the wet heat resistance and partial discharge voltage of solar cell backsheets and polyester films used therein (Patent Documents 1 and 2). Furthermore, as films to be used in mold-releasing applications, films having controlled height and number of productions (peaks) on the surface have been proposed (Patent Documents 3 and 4).

PRIOR ART DOCUMENTS

Patent Documents

[Patent Document 1] WO2011/52290
[Patent Document 2] JP 2008-305822A
[Patent Document 3] JP 2010-169869A
[Patent Document 4] JP 2010-175620A

SUMMARY OF THE INVENTION

Problems to be Solved by the Invention

In Patent Document 1, a polyester film having excellent wet heat resistance is proposed; however, even when this polyester film is used, the service life of a solar cell backsheet and that of a solar cell are not extended so much. The present inventors investigated the cause thereof and, as a result, it was revealed that the moisture resistance of a polyester film is reduced for some reason when the polyester film is incorporated into a solar cell backsheet or solar cell.

The films proposed in Patent Documents 3 and 4 are used in mold-releasing applications. Further, the technologies of Patent Documents 3 and 4 focus on projections of very low in height among those projections existing on the film surface and specify the number of such projections. Thus, even when the films of Patent Documents 3 and 4 are incorporated in a solar cell backsheet, the wet heat resistance of the resulting solar cell backsheet is very poor.

In view of the above, an object of the present invention is to provide a polyester film whose wet heat resistance is not reduced even when incorporated into a solar cell backsheet or solar cell.

Means for Solving the Problems

In order to solve the above-described problems, the present invention is characterized by the following (1) to (7).

(1) A polyester film, having a peak count $SPc\_L$ (400 nm) of not less than 100 and a peak count $SPc\_H$ (4,000 nm) of not more than 10 on at least one surface, the polyester film having an amount of terminal carboxyl groups of 0 to 25 eq/ton.

(2) The polyester film according to (1), comprising a layer containing particles of 2 μm or larger in size as the outermost layer, wherein the content of the particles is 0.1 to 5% by mass with respect to the amount of polyester in the layer containing particles of 2 μm or larger in size.

(3) The polyester film according to (2), wherein the above-described particles are aluminosilicate particles.

(4) The polyester film according to any one of (1) to (3), comprising a layer containing a resin of 500 to 3,000 nm in domain size as the outermost layer.

(5) The polyester film according to any one of (1) to (4), which is used in a solar cell backsheet.

(6) A solar cell backsheet, comprising the film according to any one of (1) to (5).

(7) A solar cell, comprising the solar cell backsheet according to (6).

Effects of the Invention

According to the present invention, a polyester film having excellent wet heat resistance can be provided.

MODE FOR CARRYING OUT THE INVENTION

Polyester used in the present invention is obtained by polycondensation of a dicarboxylic acid component and a diol component. It is noted here that the term "component" used herein refers to the smallest unit that can be obtained by hydrolysis of polyester.

Examples of the dicarboxylic acid component constituting the polyester include aliphatic dicarboxylic acids such as malonic acid, succinic acid, glutaric acid, adipic acid, suberic acid, sebacic acid, dodecanedioic acid, dimer acid, eicosanedioic acid, pimelic acid, azelaic acid, methylmalonic acid and ethylmalonic acid; alicyclic dicarboxylic acids such as adamantane dicarboxylic acid, norbornene dicarboxylic acid, isosorbide, cyclohexane dicarboxylic acid and decalin dicarboxylic acid; aromatic dicarboxylic acids such as terephthalic acid, isophthalic acid, phthalic acid, 1,4-naphthalenedicarboxylic acid, 1,5-naphthalenedicarboxylic acid, 2,6-naphthalenedicarboxylic acid, 1,8-naphthalenedicarboxylic acid, 4,4'-diphenyldicarboxylic acid, 4,4'-diphenyl ether dicarboxylic acid, 5-sodium sulfoisophthalic acid, phenylindane dicarboxylic acid, anthracene dicarboxylic acid, phenanthrene dicarboxylic acid and 9,9'-bis(4-carboxyphenyl)fluorenic acid; and ester derivatives of these dicarboxylic acids.

Further, examples of the diol component constituting the polyester include aliphatic diols such as ethylene glycol, 1,2-propanediol, 1,3-propanediol, 1,4-butanediol, 1,2-butanediol and 1,3-butanediol; alicyclic diols such as cyclohexane dimethanol, spiroglycol and isosorbide; aromatic diols such as bisphenol A, 1,3-benzene dimethanol, 1,4-benzene dimethanol and 9,9'-bis(4-hydroxyphenyl)fluorene; and a series of a plurality of these diols.

The polyester may be copolymerized with a monofunctional compound such as lauryl alcohol or phenyl isocyanate and the polyester may also be copolymerized with, for example, a trifunctional compound such as trimellitic acid, pyromellitic acid, glycerol, pentaerythritol or 2,4-dioxybenzoic acid, as long as the resulting polymer is substantially linear without being excessively branched or cross-linked.

In addition to the acid and diol components, the polyester may be further copolymerized with a small amount of an aromatic hydroxycarboxylic acid such as p-hydroxybenzoic acid, m-hydroxybenzoic acid or 2,6-hydroxynaphthoic acid, p-aminophenol or p-aminobenzoic acid, as long as the effects of the present invention are not adversely affected. In the present invention, as the polyester, polyethylene terephthalate and polyethylene naphthalate are preferably used. Alternatively, the polyester may be a copolymer or denaturation product thereof. From the standpoint of crystallinity, it is preferred that the polyester comprise polyethylene terephthalate and/or polyethylene naphthalate as main component(s). The phrase "comprise polyethylene terephthalate and/or polyethylene naphthalate as main component(s)" means that not less than 85 mol % of all repeating units of the polyester is ethylene terephthalate and/or ethylene naphthalate. It is particularly preferred that 90 mol % or more of all repeating units of the polyester be ethylene terephthalate and/or ethylene naphthalate.

The polyester film of the present invention is required to have a peak count $SPc\_L$ (400 nm) of not less than 100 and a peak count $SPc\_H$ (4,000 nm) of not more than 10 on at least one surface.

By controlling the values of the $SPc\_L$ (400 nm) and $SPc\_H$ (4,000 nm) of the polyester film surface within the above-described respective ranges, a reduction in wet heat resistance after the polyester film is incorporated into a solar cell backsheet or a solar cell can be inhibited. As a reason why such an effect is exerted, the present inventors speculate as described below.

When the polyester film is incorporated into a solar cell backsheet as well as during transfer and production of a solar cell, the polyester film repeatedly comes in contact with other members. Such contact between the polyester film and other members damages the surface of the polyester film, allowing water to infiltrate into the film therethrough. It is believed that hydrolysis of the polyester film is consequently facilitated and the wet heat resistance of the polyester film is thereby reduced. Particularly, a metal is used in the frames and the like of solar cells and metals are generally harder than polyester. Therefore, it is speculated that, when the polyester film is used in a solar cell application, the surface of the polyester film is very likely to be damaged. Here, when the $SPc\_L$ (400 nm) is not less than 100, since the area of contact with other members is reduced, the surface of the polyester film is less likely to be damaged.

When the $SPc\_L$ (400 nm) is less than 100, the surface of the polyester film is easily damaged during the production process of a backsheet as well as transfer and production of a solar cell, and water is more likely to infiltrate through the damaged surface, which leads to deterioration in the wet heat resistance, consequently causing a problem of reduction in durability. The $SPc\_L$ (400 nm) is more preferably not less than 150, still more preferably not less than 250. When the $SPc\_H$ (4,000 nm) is more than 10, a reduction in durability caused by such damage can be inhibited; however, since the surface area is increased, water is likely to infiltrate into the polyester film and this leads to a problem of deterioration in the wet heat resistance. The $SPc\_H$ (4,000 nm) is more preferably 5 or less, still more preferably 2 or less, particularly preferably 1 or less. Further, the $SPc\_L$ (400 nm) is preferably 500 or less since good durability is attained.

The $SPc\_L$ (400 nm) and $SPc\_H$ (4,000 nm) can be controlled by adjusting the size and concentration of particles to be added as well as the domain size and concentration of a resin to be added.

In the polyester film of the present invention, the amount of terminal carboxyl groups is required to be 0 to 25 eq/ton. When the amount of terminal carboxyl groups is greater than 25 eq/ton, the polyester film is likely to be hydrolyzed due to autocatalytic actions of terminal carboxyl groups, and this leads to a problem of reduction in the wet heat resistance. The upper limit of the amount of terminal carboxyl groups is more preferably 20 eq/ton, still more preferably 16 eq/ton. The amount of terminal carboxyl groups is more preferably in the range of 0 to 20 eq/ton, still more preferably 0 to 16 eq/ton. The amount of terminal carboxyl groups can be controlled by adjusting, for example, the raw materials and melt-kneading method to be used.

It is preferred that the polyester film of the present invention comprise, as the outermost layer, a layer containing particles of 2 µM or larger in size in an amount of 0.1 to 5% by mass. When the particle size is smaller than 2 µm, surface projections are not likely to be formed, so that the polyester film may be easily damaged. When the particle content is less than 0.1% by mass, since surface projections are not likely to be formed and this makes the polyester film more likely to be damaged, the durability may be reduced. When the particle content is greater than 5% by mass, since surface projections are excessively formed and this leads to an increase in the surface area, the durability may be deteriorated. The lower limit of the particle content is more preferably 0.2% by mass, still more preferably 0.4% by mass. The upper limit of the particle content is more preferably 4% by mass, still more preferably 2% by mass.

Examples of the particle type include inorganic particles and organic particles. Examples of the inorganic particles include clay, mica, titanium oxide, calcium carbonate, kaolin, talc, wet-type silica, dry-type silica, colloidal silica, calcium phosphate, barium sulfate, alumina, zirconia and aluminosilicate particles. Further, examples of the organic particles include those particles comprising an acrylic acid, a styrene resin, a thermosetting resin, silicone, an imide compound or the like as a constituent. Particles that are precipitated by a catalyst or the like added at the time of performing a polyester polymerization reaction (so-called internal particles) can also be preferably used. Thereamong, aluminosilicate particles are preferred because of their low hygroscopicity. Since those particles of low hygroscopicity retain only a small amount of water, even when a film is formed with an addition of such particles to a polyester, deterioration of the polyester caused by water is inhibited, so that the durability of the resulting film is likely to be improved.

By using such particles, the surface roughness of the polyester film can be controlled.

As described above, the film of the present invention comprises a polyester. The film of the present invention may also comprise a resin that is different from the polyester constituting the film. Particularly, the film of the present invention may also comprise a resin that is not compatible with the polyester constituting the film (hereinafter, referred to as "incompatible resin"). In the film of the present invention, such an incompatible resin is preferably dispersed in the polyester. The reason for this is because it allows projections to be formed on the film surface. It is preferred that the incompatible resin contained in the film have a domain size of 500 to 3,000 nm. When the domain size is smaller than 500 nm, since surface projections are not likely to be formed and this makes the polyester film more likely to be damaged, the durability may be reduced. When the domain size is larger than 3,000 nm, surface projections are excessively formed, so that the durability of the film may be reduced.

The type of the incompatible resin is not particularly restricted as long as it is different from the polyester constituting the film. The incompatible resin may be, for example, a polyester resin (which is, however, required to be of a different type from the polyester constituting the film), a styrene resin or a polyimide resin, and the incompatible resin is particularly preferably a polyester resin.

In cases where the film has a laminated structure, it is preferred that a layer containing the incompatible resin be arranged as the outermost layer. The reason for this is because surface projections can be efficiently formed by arranging the layer containing an incompatible resin as the outermost layer. It is noted here that the domain size is controlled by adjusting the type and viscosity of the resin.

In the present invention, the thickness of the polyester film can be determined in accordance with the intended use and, in a solar cell backsheet application, the thickness of the polyester film is preferably 25 to 250 µm. When the thickness is less than 25 µm, there are problems in that, for example, the film does not have sufficient firmness and transportation thereof is thus difficult. Meanwhile, when the thickness is greater than 250 µm, the film is excessively thick and its processability may thus be poor. The lower limit of the thickness is more preferably 30 µm, still more preferably 40 µm. Further, the upper limit of the thickness is more preferably 220 µm, still more preferably 200 The thickness is more preferably in the range of 30 to 220 µm, still more preferably 40 to 200 µm.

The above-described polyester film of the present invention is produced, for example, as described below. In order to produce the polyester film, for example, a polyester pellet is melted in an extruder, extruded from a mouthpiece, and then solidified by cooling to be molded into a sheet form. In this case, in order to remove unmelted materials from the polymer, the polymer may be filtered through a fiber-sintered stainless-metal filter.

In addition, in such an amount that does not adversely affect the effects of the present invention, a variety of additives, such as a compatibilizer, a plasticizer, an anti-weathering agent, an antioxidant, a heat stabilizer, a lubricant, an electrification inhibitor, a brightening agent, a coloring agent, a conductive agent, a flame retardant, a flame retardant aid, a pigment and a dye, may also be added.

Then, the sheet-form article obtained in the above-described manner is biaxially stretched in the machine and transverse directions and subsequently heat-treated. As for the mode of stretching, the present invention encompasses sequential biaxial stretching in which, for example, stretching is performed in the machine direction and then in the transverse direction; simultaneous biaxial stretching in which stretching is performed in both the machine and transverse directions at the same time using a simultaneous biaxial tenter or the like; and a combination of sequential biaxial stretching and simultaneous biaxial stretching.

A method of producing the polyester film of the present invention will now be described by way of a representative example where polyethylene terephthalate (PET) is used as polyester. It is needless to say that the present invention is not restricted to a polyester film in which PET is used and that other polymer may be used as well. For example, in cases where polyethylene-2,6-naphthalene dicarboxylate or the like, which has a high glass transition temperature and a high melting point, is used to constitute a polyester film, extrusion and stretching can be carried out at a temperature higher than the temperature described below.

First, polyethylene terephthalate is prepared. This polyethylene terephthalate is produced by either of the following processes, that is, (1) a process in which a low-molecular-weight polyethylene terephthalate or oligomer is obtained by direct esterification reaction using terephthalic acid and ethylene glycol as raw materials and a polymer is then obtained by subsequent polycondensation reaction using antimony trioxide or the like as a catalyst; and (2) a process in which a low-molecular-weight product is obtained by transesterification reaction using dimethyl terephthalate and ethylene glycol as raw materials and a polymer is then obtained by subsequent polycondensation reaction using antimony trioxide or the like as a catalyst. It is preferred that the thus obtained PET pellet be heat-treated at a temperature of 220° C. for at least 8 hours under a reduced pressure of 1 mmHg using a rotary vacuum polymerization apparatus so as to increase the intrinsic viscosity.

In cases where a resin or particles are incorporated into the polyester constituting the film, a method in which a PET pellet (masterbatch) containing particles or a resin at a high concentration is prepared by directly mixing the particles or a resin with a PET pellet and kneading the particles or a resin into PET using a vented biaxial kneading extruder heated to 270 to 295° C. is effective.

Next, after drying the thus obtained PET pellet (and, as required, the masterbatch) at a temperature of 180° C. for at least 3 hours under reduced pressure, the dried PET pellet is fed to an extruder heated to 265 to 280° C. under nitrogen gas flow or under reduced pressure so that the intrinsic viscosity is not reduced. The PET pellet is then extruded from a slit T-die and cooled on a casting roll to obtain an unstretched film. In cases where the film is laminated, two or more extruders and a manifold or joint block are used to melt and laminate a plurality of different polymers.

Thereafter, the thus obtained unstretched film is biaxially stretched. A biaxial stretching method in which a film is stretched in the longitudinal direction (MD stretching) using a longitudinal stretching machine equipped with several rolls and utilizing the difference in the peripheral speeds of the rolls and then stretched in the lateral direction (TD stretching) using a stenter will now be described.

First, an unstretched film is subjected to MD stretching. The longitudinal stretching machine comprises a preheating roll, a stretching roll and a cooling roll as well as a nip roll which reduces tension and inhibits film slippage. In the MD stretching, the film traveling on the stretching roll is pressed down and nipped by the stretch-nip roll with a constant pressure (nip pressure) to reduce tension and the film is stretched by the difference in peripheral speed between the stretching roll and the following cooling roll that are rotating. As described above, the stretching roll and the stretch-nip roll are rolls for pressing and nipping the film. Therefore, in order to prevent the surface projections of the film from being crushed, it is preferred that the stretching roll and the stretch-nip roll be both silicon rolls having a surface hardness, which is measured by a durometer (type A) in accordance with JIS-K 6253 (2006), of 30° to 70°. When the surface hardness is higher than 70°, the projections are crushed and the film surface may thus be likely to be damaged. The surface hardness is more preferably 30° to 45°. When the surface hardness is higher than 45°, the projections are crushed and the film surface may thus be likely to be damaged. Meanwhile, when the surface hardness is less than 30°, tension may not be sufficiently reduced by the rolls and this may result in the occurrence of non-uniform stretching, which is not preferred. Further, the nip pressure is preferably 0.05 to 0.2 Pa. When the nip pressure is higher than 0.2 MPa, the projections are crushed and the film surface may thus be likely to be damaged. The nip pressure is more preferably 0.05 to 0.15 MPa. When the nip pressure is higher than 0.15 MPa, the projections are crushed and the film surface may thus become more likely to be damaged. Meanwhile, when the nip pressure is less than 0.05 MPa, tension may not be sufficiently reduced by the rolls and this may result in the occurrence of non-uniform stretching, which is not preferred. The MD stretching is performed at a temperature of (glass transition temperature (hereinafter, referred to as "Tg")+10) to (Tg+50)° C. and a draw ratio of 1.2 to 5.0 times. After the stretching, the thus stretched film is cooled by a group of cooling rolls at 20 to 50° C.

Next, using a stenter, the resulting film is stretched in the transverse direction (TD stretching). A stenter is an apparatus which laterally stretches a film by spreading the space between the clips holding each end of the film and is divided into a preheating zone, a stretching zone, a heat treatment zone and a cooling zone. The air flow rate in the preheating zone is preferably 1 to 20 m/s. When the air flow rate in the preheating zone is higher than 20 m/s, the projecting parts of the surface are rapidly heated, so that the projections may be reduced in size. In addition, as a result, the number of projections on the film surface is also reduced; therefore, there is a problem that the film surface is likely to be damaged. The air flow rate in the preheating zone is more preferably 1 to 5 m/s. When the air flow rate is higher than 5 m/s, since the projecting parts of the surface are rapidly heated, the projections may be further reduced in size. In addition, as a result, the number of projections on the film surface is also reduced and the film surface may thus be easily damaged. When the air flow rate is lower than 1 m/s, the film temperature is likely to be uneven and breakage by stretching is likely to occur; therefore, such an air flow rate is not preferred. The air flow rate is measured at the nozzle outlet and the space between the nozzle and the film is preferably 120 mm. The TD stretching is performed at a draw ratio of 2.0 to 6.0 times and a temperature of (Tg) to (Tg+50)° C. After the TD stretching, the resulting film is subjected to a heat fixation treatment. In this heat fixation treatment, the film is heat-treated in a temperature range of 150 to 240° C. while being extended or relaxed in the transverse direction. The heat treatment is performed for 0.5 to 10 seconds. Subsequently, the thus heat-treated film is cooled to 25° C. in the cooling zone. The air flow rate in the cooling zone is preferably 3 to 30 m/s. When the air flow rate in the cooling zone is lower than 3 m/s, since it takes a long time for the film to be cooled and the surface projections are reduced in size, there is a problem that the film surface is likely to be damaged. The air flow rate in the cooling zone is more preferably 15 to 30 m/s. When the air flow rate is lower than 15 m/s, it takes a long time for the film to be cooled and the surface projections are reduced in size, so that the film surface may be easily damaged. Meanwhile, when the air flow rate is higher than 30 m/s, the film is locally cooled and non-uniform cooling results in non-uniform physical properties; therefore, such an air flow rate is not preferred. Thereafter, by removing film edges, the polyester film of the present invention can be obtained.

[Evaluation Methods of Properties]

(1) Peak Counts, SPc_L (400 nm) and SPc_H (4,000 nm)

Using a stylus-type high-precision microprofile measuring apparatus (three-dimensional surface roughness meter), the surface morphology of a subject polyester film is measured in accordance with JIS B0601 (1994) under the following conditions.

Measuring apparatus: three-dimensional microprofile measuring apparatus (model: ET-4000A), manufactured by Kosaka Laboratory Ltd.

Analyzer: three-dimensional surface roughness analysis system (model: TDA-31)

Stylus: tip radius=0.5 µmR, diameter=2 µm, made of diamond

Stylus pressure: 100 µN

Measurement direction: the film is measured once in each of the machine and transverse directions and an average thereof is taken.

Measurement length in the X direction: 1.0 mm

Feeding rate in the X direction: 0.1 mm/s (measurement rate)

Feeding pitch in the Y direction: 5 µm. (measurement interval)

Number of lines in the Y direction: 81 (number of measured lines)

Magnification in the Z direction: ×20 (longitudinal magnification)

Low-range cut-off: 0.20 mm (waviness cut-off value)

High-range cut-off: R+W mm (roughness cut-off value); "R+W" means no cut-off

Filtering mode: Gaussian space-type

Leveling: performed (gradient correction)

Reference area: 1 mm$^2$

The SPc_L (400 nm) represents the number of projections of 400 nm or higher in the reference area and the SPc_H (4,000 nm) represents the number of projections of 4,000 nm or higher in the reference area. These values are determined by analyzing the projections using an analysis system.

Setting of the slice level condition: fixed vertical intervals

Central pitch level: 0.05 µm

Vertical level interval: 0.025 µm

SPc_L (400 nm): SPc value of lower limit=375 nm, median level=400 nm and upper limit=425 nm SPc_H (4,000 nm): SPc value of lower limit=3,975 nm, median level=4,000 nm and upper limit=4,025 nm (2) Amount of Terminal Carboxyl Groups The amount of terminal carboxyl groups is measured for the entirety of a subject film by the method described by Maulice (Reference: M. J. Maulice, F. Huizinga, Anal. Chim. Acta, 22: 363 (1960)).

(3) Particle Size Measurement

The surface of a subject film is etched with 1N potassium hydroxide in methanol solution to expose particles, and photographs of 100 viewing fields are taken under a scanning electron microscope (SEM) at a magnification of ×10,000. The area of each particle on the thus taken photographs was measured using an image analyzer and the diameter of a circle having the same area as the measured area was calculated and defined as the equivalent circle diameter. For each particle, the diameter of equivalent circle was determined and defined as the size of the particle.

(4) Particle Content

To 200 ml of 1N potassium hydroxide in methanol solution, 1 g of a subject polymer pellet or film was loaded and heated to reflux so as to dissolve polymer. Then, 200 ml of water was added to the resulting solution and the thus obtained liquid was centrifuged to precipitate inert particles, followed by removal of supernatant. The particles were further washed by adding water thereto and centrifuged twice. The thus obtained particles were filtered through a filter paper allowing particles of smaller than 2 µm to pass therethrough, followed by drying. The mass of the thus dried particles was measured to determine the particle content.

(5) Domain Size of Resin in Film

In the present invention, the domain size of a resin in a film means the average length of the elliptical major axis of domain sizes measured on plural observation surfaces and it can be determined by the following measurement method.

First, a cross-section of a subject film is observed under a transmission electron microscope at an accelerating voltage of 100 kV and a photograph thereof taken at a magnification of ×20,000 is scanned into an image analyzer. Then, 100 arbitrary dispersed phases (island parts) are selected and, as required, image processing is performed to determine their domain size as a number-average value. Specifically, this process is carried out as follows.

A subject film was cut by an ultra-thin cutting method (a) in the direction parallel to the machine direction and perpendicular to the film surface, (b) in the direction parallel to the transverse direction and perpendicular to the film surface and (c) in the direction parallel to the film surface (that is, in the direction perpendicular to the film thickness direction), thereby preparing samples. In order to highlight the contrast of dispersed phases, the samples may be stained with osmic acid, ruthenium acid or the like. The cut surfaces are observed under a transmission electron microscope (model H-7100FA, manufactured by Hitachi Ltd.) at an accelerating voltage of 100 kV and photographs thereof are taken at a magnification of ×20,000. The thus obtained photographs were scanned into an image analyzer as images. Then, 100 arbitrary dispersed phases were selected and, as required, image processing was performed to determine the size of the respective dispersed phases as described below. The maximum length (La) of each dispersed phase appearing on the cut surface of (a), the maximum length (Lb) of each dispersed phase appearing on the cut surface of (b) and the maximum length (Lc) of each dispersed phase appearing on the cut surface of (c) were measured. Then, the average domain size of the dispersed phases was determined as (La+Lb+Lc)/3. That is, La is determined as the number-average value of the maximum length measured for 100 arbitrary dispersed phases on the cut surface of (a); Lb is determined as the number-average value of the maximum length measured for 100 arbitrary dispersed phases on the cut surface of (b); and Lc is determined as the number-average value of the maximum length measured for 100 arbitrary dispersed phases on the cut surface of (c). The value of (La+Lb+Lc)/3 was defined as the average domain size of the dispersed phases.

As for the method of the above-described image processing, it is performed as follows. That is, transmission electron micrographs of each sample were scanned into a computer using a scanner. Then, the scanned micrographs were image-processed using a special software (Image-Pro Plus ver. 4.0, manufactured by Planetron Co., Ltd.). The brightness and contrast were adjusted by manipulating the tone curve and images were then prepared by applying a Gaussian filter. Here, in a case where negative transmission electron micrographs are used, Leafscan 45 Plug-In manufactured by Japan Scitex Co., Ltd. is employed as the above-described scanner and, in a case where positive transmission electron micrographs are used, GT-7600S manufactured by Seiko Epson Corporation is employed as the above-described scanner. In both of these cases, the same value is obtained.

[Procedure and Parameter of Image Processing]

Flattening: once
Contrast: +30
Application of a Gaussian filter: once
Contrast: +30, Brightness: −10
Application of a Gaussian filter: once
Flattening filter (hereinafter, may be referred to as "planarization filter"): background (black), object width (20 pix)
Gaussian filter: size (7), strength (10)

(6) Elongation at Break

In accordance with ASTM-D882 (1997), samples were cut out in a size of 1 cm×20 cm and stretched at a chuck distance of 5 cm and a tensile rate of 300 mm/min to measure the elongation at break. Here, the number of samples was 5 (n=5) and, after performing the measurement in both the machine and transverse directions of the subject film, the elongation at break of the film was determined as the average of the measured values.

(7) Durability

In order to evaluate the effect of scratches on the durability of the subject film, first, the film surface of 5 cm×20 cm in size is rubbed 10 times with a sandpaper (#800) at a contact pressure of 0.01 MPa and the wet heat resistance is evaluated. After cutting out the rubbed film into measurement pieces (1 cm×20 cm), the thus obtained measurement pieces are treated in a pressure cooker manufactured by Tabai ESPEC Corp. at a temperature of 125° C. and a relative humidity of 100% RH, and the elongation at break is then measured in accordance with the above (6). Here, the measurement is carried out for 5 pieces (n=5) and, after performing the measurement in both the machine and transverse directions of the film, the elongation at break E1 of the film is determined as the average of the measured values. In addition, for the film before the treatment as well, the elongation at break E0 is measured in accordance with the above (6). From the thus obtained values of elongation at break, E0 and E1, the retention of elongation is calculated using the following equation (f) and the treatment time at which the retention of elongation is 50% is defined as half-life of elongation.

$$\text{Retention of elongation (\%)}=E1/E0\times100 \qquad (f)$$

Based on the thus obtained half-life of elongation, the film durability was evaluated as follows.

When the half-life of elongation was 65 hours or longer: A

When the half-life of elongation was 55 hours to shorter than 65 hours: B

When the half-life of elongation was 45 hours to shorter than 55 hours: C

When the half-life of elongation was 35 hours to shorter than 45 hours: D

When the half-life of elongation was shorter than 35 hours: E

The evaluations of A to C are good and thereamong, A is the best evaluation.

(8) Durability of Backsheet

The subject film was rolled out from a film roll and transported in a metal roll, and an adhesive prepared by mixing commercially-available polyester-based main adhesive LX703VL and polyisocyanate-based curing agent KR90 (both of which are manufactured by DIC Corporation) at a weight ratio of 15:1 (dry weight: 4 g/m$^2$) was coated on the film surface. Then, the resulting film and an alumina-vapor-deposited transparent film (Barrialox (registered trademark) manufactured by Toray Advanced Film Co., Ltd.; thickness=12 μm), which is a gas barrier film, were dry-laminated to prepare a solar cell backsheet. This backsheet was transported in a metal roll and subsequently rolled out. In order to evaluate the effect of scratches made during transport on the durability of the backsheet, the durability of the thus obtained backsheet was evaluated in the same manner as in the above (7), except that the backsheet was not rubbed with sandpaper.

When the half-life of elongation was 65 hours or longer: A

When the half-life of elongation was 55 hours to shorter than 65 hours: B

When the half-life of elongation was 45 hours to shorter than 55 hours: C

When the half-life of elongation was 35 hours to shorter than 45 hours: D

When the half-life of elongation was shorter than 35 hours: E

The evaluations of A to C are good and thereamong, A is the best evaluation.

(9) Durability of Solar Cell Panel

On the solar cell backsheet obtained in (8), an ethylene-vinyl acetate copolymer resin (hereinafter, referred to as "EVA") sheet, a solar cell and a light-transmitting glass plate are laminated and integrated by heat-pressing to form a solar cell module. Then, the thus obtained solar cell module is taken out and fed to the panel loading step of a solar cell panel production line. In the primer coating step, the surface to be adhered with an aluminum frame is coated with a primer. Subsequently, after leaving the solar cell module in the drying step for about 1 minute to dry the primer, the resulting solar cell module is exported from the exporting step to the side of the frame production line. Meanwhile, a previously assembled aluminum frame is loaded to the frame production line. The aluminum frame comprises projections for supporting the opposite surface of the light-receiving surface of the solar cell module on which the solar cell has been arranged. The aluminum frame is shaped such that it can be arranged over the entire periphery of the solar cell module and has a structure in which the light-receiving surface side of the solar cell module is in an open condition. Then, the primer-coated solar cell module is transferred and, in the panel-laminating step, the aluminum frame coated with a primer and the solar cell module are mounted (solar cell panel-adhering step). Lastly, as required, in the molding-fitting step, a molding is attached to produce a solar cell panel. After verifying that there was no breakage or cracking on the back surface of the thus obtained solar cell panel, the solar cell panel was treated for 3,000 hours at a temperature of 85° C. and a relative humidity of 85% RH, and the appearance of the back surface and the reduction in output power (JIS-C8913 (1998)) were evaluated as follows.

The solar cell panel was observed with no breakage or cracking and the output power was not reduced (The reduction in the output power was less than 10% with respect to the initial output power): A The solar cell panel was observed with slight breakage and/or cracking and the output power was somewhat reduced (The reduction in the output power was 10% to less than 30% with respect to the initial output power): B The solar cell panel was observed with breakage and/or cracking and the output power was largely reduced (The reduction in the output power was 30% to less than 50% with respect to the initial output power): C The solar cell panel was observed with a large amount of breakage and/or cracking and the output power was hardly generated (The reduction in the output power was 50% to less than 80% with respect to the initial output power): D The solar cell panel was observed with severe breakage and/or cracking and the output power was not generated (The reduction in the output power was 80% or more with respect to the initial output power): E The evaluations of A to C are good and thereamong, A is the best evaluation.

EXAMPLES

Reference Example 1

Polyester Chip α-1

A polyester chip α-1 was produced by the following method.

To a transesterification apparatus, 100 parts by mass of dimethyl terephthalate and 64 parts by mass of ethylene glycol were loaded, and these contents were dissolved by heating at a temperature of 140° C. Then, while stirring the resultant, 0.09 parts by mass of calcium acetate and 0.03 parts by mass of antimony trioxide were added thereto to carry out a transesterification reaction with methanol being distillated off at a temperature of 140 to 230° C. Thereafter, 0.18 parts by mass of lithium acetate and 4.8 parts by mass of 5%-by-mass ethylene glycol solution of trimethyl phosphate (0.24 parts by mass in terms of trimethyl phosphate) were further added. Once the temperature of the reaction contents in the transesterification apparatus reached a temperature of 230° C., the reaction contents were transferred to a polymerization apparatus.

After transferring the reaction contents to the polymerization apparatus, the temperature of the reaction system was slowly increased from 230° C. to 290° C. and the pressure was reduced to 0.1 kPa. The time for reaching the final temperature of 290° C. and the time for reaching the final pressure of 0.1 kPa were both set at 60 minutes. After reaching the final temperature and pressure, the reaction system was allowed to react for 2 hours (3 hours after the start of polymerization). Thereafter, the pressure of the reaction system was restored to normal pressure by purging with nitrogen so as to terminate the polymerization reaction and the reaction product was extruded into cold water in the form of a strand and immediately cut, thereby obtaining a polyester chip α. The thus obtained polyester chip α had a grass transition temperature of 80° C., a cold crystallization temperature of 157° C., a melting point of 255° C., an intrinsic viscosity of 0.52 and an amount of terminal carboxyl groups of 15.0 eq/ton.

The polyester chip α was dried and crystallized at 160° C. for 6 hours under vacuum. Then, the resulting polyester chip α was subjected to solid phase polymerization at 220° C. for 8 hours under vacuum to obtain a polyester chip α-1. The thus obtained polyester chip α-1 had a grass transition temperature of 82° C., a cold crystallization temperature of 165° C., a melting point of 255° C., an intrinsic viscosity of 0.85 and an amount of terminal carboxyl groups of 10 eq/ton.

Example 1

The polyester chip α-1 and silica having the particle size shown in Table 1 were mixed and the resulting mixture was melt-kneaded to prepare a master pellet. Here, the thus obtained master pellet had a silica concentration of 10% by mass.

Then, this master pellet was mixed with the polyester chip α-1, and the resulting mixture was dried under reduced pressure at 180° C. for 3 hours, fed to an extruder E heated to 280° C. and introduced to a T-die mouthpiece. Here, the mixture of the master pellet and polyester chip α-1 was mixed and introduced such that the silica concentration became as shown in Table 1.

Subsequently, the molten mixture of the polyester chip α-1 and masterbatch was extruded from the T-die mouthpiece in the form of a sheet to obtain a molten monolayer sheet, and this molten monolayer sheet was cooled and solidified in contact with a casting drum having a surface temperature of 25° C. while applying thereto a static charge, thereby preparing an unstretched film. The thus obtained unstretched film was preheated with a group of heated rolls and then stretched in the machine direction at a temperature of 90° C. and a draw ratio of 3.5 times using a silicon stretching roll (surface hardness: 40°) and a silicon nip roll (surface roughness: 40°) with a nip pressure of 0.1 MPa. Thereafter, the resulting film was cooled with a group of rolls having a temperature of 25° C. to obtain a uniaxially stretched film. The thus obtained uniaxially stretched film was introduced to a 80° C. preheating zone (nozzle air flow rate: 3 m/s, nozzle-film distance: 120 mm) in a tenter with both ends of the film being held with clips, and then continuously stretched in the width direction (TD direction) perpendicular to the machine direction at a draw ratio of 3.7 times in a 90° C. heating zone. Further, in a heat treatment zone of the tenter, the resulting film was heat-treated at a temperature of 210° C. for 10 seconds and then relaxed by 4% in the width direction at a temperature of 210° C. Thereafter, the resulting film was uniformly cooled in a cooling zone (nozzle air flow rate: 15 m/s, nozzle-film distance: 120 mm) and wound to obtain a 50 μm-thick biaxially stretched film (roll). The properties of the thus obtained polyester film and the like are shown in Table 1-1.

Examples 2 to 18 and 28 to 41

Comparative Examples 1 to 18 and 28 to 30

The respective polyester films were obtained in the same manner as in Example 1 except that the compositions thereof were changed as shown in Tables 1-1, 1-2, 1-3 and 2. The properties of the thus obtained polyester films and the like are shown in Tables 1-1, 1-2, 1-3 and 2. It is noted here that, as raw materials, masterbatches in which the type and concentration of the additive were changed were used (the concentration values [% by mass] shown in Table 2 for Examples 29 to 40 each represent the concentration of a blended incompatible resin with respect to the total weight of a layer containing the incompatible resin (polyester+ incompatible resin).

Examples 19 to 27

Comparative Examples 19 to 27

The respective polyester films were obtained in the same manner as in Example 1, except that only the polyester chip α-1 obtained in Reference Example 1 was dried under reduced pressure at 180° C. for 3 hours, fed to the extruder E heated to 280° C. and then introduced to the T-die mouthpiece. The thus obtained polyester films were molded using an imprint apparatus equipped with a die such that the resultants had the respective surface profiles shown in Tables 1-1, 1-2 and 1-3. The properties of the thus obtained polyester films and the like are shown in Tables 1-1, 1-2 and 1-3.

Examples 42 to 49

Comparative Examples 31 and 32

The respective polyester films were obtained in the same manner as in Example 5 except that the conditions for forming each polyester film were changed as shown in Table 3. The properties of the thus obtained polyester films and the like are shown in Table 3.

Examples 50 to 57

Comparative Examples 33 and 34

The respective polyester films were obtained in the same manner as in Example 14 except that the conditions for forming each polyester film were changed as shown in Table 3. The properties of the thus obtained polyester films and the like are shown in Table 3.

Example 58

The polyester chip α-1 and silica having the particle size shown in Table 4 were mixed and the resulting mixture was melt-kneaded to prepare a master pellet. Here, the thus obtained master pellet had a silica concentration of 10% by mass.

Then, this master pellet was mixed with the polyester chip α-1, and the resulting mixture was dried under reduced pressure at 180° C. for 3 hours, fed to the extruder E heated to 280° C. and introduced to the T-die mouthpiece. Here, the mixture of the master pellet and polyester chip α-1 was mixed and introduced such that the silica concentration became as shown in Table 1.

Further, after drying the polyester chip α-1 obtained in Reference Example 1 under reduced pressure at 180° C. for 3 hours, the resulting polyester chip α-1 was fed to an extruder F heated to 280° C. and introduced to a T-die mouthpiece.

The molten materials fed to the extruder E and the materials fed to the extruder F were merged in a T-die mouthpiece to be laminated with each other and the resultant was extruded from the T-die mouthpiece in the form of a sheet to obtain a molten laminated sheet. This molten laminated sheet was then cooled and solidified in contact with a casting drum having a surface temperature of 25° C. while applying thereto a static charge, thereby preparing an unstretched film (laminated film). The lamination ratio of the thus obtained unstretched film, layer A (a layer constituted by the materials fed to the extruder E)/layer B (a layer constituted by the materials fed to the extruder F), was ¼. From this unstretched sheet, a biaxially stretched film was obtained in the same manner as in Example 1 (it is noted here that the surface of the side in which the layer A was arranged and the surface of the side in which the layer B was arranged are hereinafter referred as "surface A" and "surface B", respectively). The properties of the thus obtained polyester film and the like are shown in Table 4-1.

Examples 59 to 75

Comparative Examples 35 to 52

The respective polyester films were obtained in the same manner as in Example 58 except that the compositions thereof were changed as shown in Tables 4-1 and 4-2. The properties of the thus obtained polyester films and the like are shown in Tables 4-1 and 4-2. It is noted here, however, that the polyester chip α-1 and masterbatches in which the additive was changed were used as raw materials.

Examples 76 and 77

Comparative Examples 53 to 55

The respective polyester films were obtained in the same manner as in Example 5 except that the conditions for forming each polyester film were changed as shown in Table 5. The properties of the thus obtained polyester films and the like are shown in Table 5.

Examples 78 and 79

Comparative Examples 56 to 58

The respective polyester films were obtained in the same manner as in Example 14 except that the conditions for forming each polyester film were changed as shown in Table 5. The properties of the thus obtained polyester films and the like are shown in Table 5.

Examples 80 to 88

The respective polyester films were obtained in the same manner as in Example 1 except that the compositions thereof were changed as shown in Table 6. The properties of the thus obtained polyester films and the like are shown in Table 6. It is noted here, however, that the polyester chip α-1 and masterbatches in which the additive was changed were used as raw materials.

TABLE 1-1-2

|  | Polyester film Durability | | Backsheet Durability | | Solar cell panel Durability |
| --- | --- | --- | --- | --- | --- |
| Example 1 | A | 65 | A | 65 | A |
| Example 2 | B | 55 | B | 55 | B |
| Example 3 | C | 45 | C | 45 | C |
| Example 4 | A | 90 | A | 90 | A |
| Example 5 | A | 70 | A | 70 | A |
| Example 6 | B | 60 | B | 60 | B |
| Example 7 | A | 65 | A | 65 | A |
| Example 8 | B | 55 | B | 55 | B |
| Example 9 | C | 45 | C | 45 | C |
| Example 10 | A | 65 | A | 65 | A |
| Example 11 | B | 55 | B | 55 | B |
| Example 12 | C | 45 | C | 45 | C |
| Example 13 | A | 90 | A | 90 | A |
| Example 14 | A | 70 | A | 70 | A |
| Example 15 | B | 60 | B | 60 | B |
| Example 16 | A | 65 | A | 65 | A |
| Example 17 | B | 55 | B | 55 | B |
| Example 18 | C | 45 | C | 45 | C |
| Example 19 | A | 65 | A | 65 | A |
| Example 20 | B | 55 | B | 55 | B |
| Example 21 | C | 45 | C | 45 | C |
| Example 22 | A | 90 | A | 90 | A |
| Example 23 | A | 70 | A | 70 | A |

TABLE 1-1-1

|  | Polyester | Additive | Particle size [μm] | Concentration [% by mass] | Processing method | COOH [eq/t] | SPc_L [number] | SPc_H [number] | Domain size [nm] |
| --- | --- | --- | --- | --- | --- | --- | --- | --- | --- |
| Example 1 | PET | silica | 2 | 0.1 |  | 0 | 100 | 0 |  |
| Example 2 | PET | silica | 2 | 0.1 |  | 15 | 100 | 0 |  |
| Example 3 | PET | silica | 2 | 0.1 |  | 25 | 100 | 0 |  |
| Example 4 | PET | silica | 4 | 0.5 |  | 0 | 250 | 0 |  |
| Example 5 | PET | silica | 4 | 0.5 |  | 15 | 250 | 0 |  |
| Example 6 | PET | silica | 4 | 0.5 |  | 25 | 250 | 0 |  |
| Example 7 | PET | silica | 4 | 5 |  | 0 | 500 | 10 |  |
| Example 8 | PET | silica | 4 | 5 |  | 15 | 500 | 10 |  |
| Example 9 | PET | silica | 4 | 5 |  | 25 | 500 | 10 |  |
| Example 10 | PET | PCHT |  | 2 |  | 0 | 100 | 0 | 1,000 |
| Example 11 | PET | PCHT |  | 2 |  | 15 | 100 | 0 | 1,000 |
| Example 12 | PET | PCHT |  | 2 |  | 25 | 100 | 0 | 1,000 |
| Example 13 | PET | PCHT |  | 5 |  | 0 | 250 | 0 | 1,000 |
| Example 14 | PET | PCHT |  | 5 |  | 15 | 250 | 0 | 1,000 |
| Example 15 | PET | PCHT |  | 5 |  | 25 | 250 | 0 | 1,000 |
| Example 16 | PET | PCHT |  | 10 |  | 0 | 500 | 10 | 1,000 |
| Example 17 | PET | PCHT |  | 10 |  | 15 | 500 | 10 | 1,000 |
| Example 18 | PET | PCHT |  | 10 |  | 25 | 500 | 10 | 1,000 |
| Example 19 | PET |  |  |  | Imprint 1 | 0 | 100 | 0 |  |
| Example 20 | PET |  |  |  | Imprint 1 | 15 | 100 | 0 |  |
| Example 21 | PET |  |  |  | Imprint 1 | 25 | 100 | 0 |  |
| Example 22 | PET |  |  |  | Imprint 2 | 0 | 250 | 0 |  |
| Example 23 | PET |  |  |  | Imprint 2 | 15 | 250 | 0 |  |

TABLE 1-2-1

| | Polyester | Additive | Particle size [μm] | Concentration [% by mass] | Processing method | COOH [eq/t] | SPc_L [number] | SPc_H [number] | Domain size [nm] |
|---|---|---|---|---|---|---|---|---|---|
| Example 24 | PET | | | | Imprint 2 | 25 | 250 | 0 | |
| Example 25 | PET | | | | Imprint 3 | 0 | 500 | 10 | |
| Example 26 | PET | | | | Imprint 3 | 15 | 500 | 10 | |
| Example 27 | PET | | | | Imprint 3 | 25 | 500 | 10 | |
| Comparative Example 1 | PET | silica | 1.5 | 1 | | 0 | 90 | 0 | |
| Comparative Example 2 | PET | silica | 1.5 | 1 | | 15 | 90 | 0 | |
| Comparative Example 3 | PET | silica | 1.5 | 1 | | 25 | 90 | 0 | |
| Comparative Example 4 | PET | silica | 4 | 6 | | 0 | 500 | 11 | |
| Comparative Example 5 | PET | silica | 4 | 6 | | 15 | 500 | 11 | |
| Comparative Example 6 | PET | silica | 4 | 6 | | 25 | 500 | 11 | |
| Comparative Example 7 | PET | silica | 4 | 0.1 | | 26 | 100 | 0 | |
| Comparative Example 8 | PET | silica | 4 | 0.5 | | 26 | 250 | 0 | |
| Comparative Example 9 | PET | silica | 4 | 5 | | 26 | 500 | 10 | |
| Comparative Example 10 | PET | PCHT | | 1 | | 0 | 90 | 0 | 1,000 |
| Comparative Example 11 | PET | PCHT | | 1 | | 15 | 90 | 0 | 1,000 |
| Comparative Example 12 | PET | PCHT | | 1 | | 25 | 90 | 0 | 1,000 |
| Comparative Example 13 | PET | PCHT | | 15 | | 0 | 500 | 11 | 1,000 |
| Comparative Example 14 | PET | PCHT | | 15 | | 15 | 500 | 11 | 1,000 |
| Comparative Example 15 | PET | PCHT | | 15 | | 25 | 500 | 11 | 1,000 |
| Comparative Example 16 | PET | PCHT | | 2 | | 26 | 100 | 0 | 1,000 |
| Comparative Example 17 | PET | PCHT | | 5 | | 26 | 250 | 0 | 1,000 |
| Comparative Example 18 | PET | PCHT | | 15 | | 26 | 500 | 10 | 1,000 |
| Comparative Example 19 | PET | | | | Imprint 4 | 0 | 90 | 0 | |

TABLE 1-2-2

| | Polyester film Durability | | Backsheet Durability | | Solar cell panel Durability |
|---|---|---|---|---|---|
| Example 24 | B | 60 | B | 60 | B |
| Example 25 | A | 65 | A | 65 | A |
| Example 26 | B | 55 | B | 55 | B |
| Example 27 | C | 45 | C | 45 | C |
| Comparative Example 1 | D | 40 | D | 40 | D |
| Comparative Example 2 | E | 30 | E | 30 | E |
| Comparative Example 3 | E | 25 | E | 25 | E |
| Comparative Example 4 | D | 40 | D | 40 | D |
| Comparative Example 5 | D | 35 | D | 35 | D |
| Comparative Example 6 | E | 25 | E | 25 | E |
| Comparative Example 7 | E | 30 | E | 30 | E |
| Comparative Example 8 | D | 35 | D | 35 | D |
| Comparative Example 9 | E | 25 | E | 25 | E |
| Comparative Example 10 | D | 40 | D | 40 | D |
| Comparative Example 11 | E | 30 | E | 30 | E |
| Comparative Example 12 | E | 25 | E | 25 | E |
| Comparative Example 13 | D | 40 | D | 40 | D |
| Comparative Example 14 | D | 35 | D | 35 | D |
| Comparative Example 15 | E | 25 | E | 25 | E |
| Comparative Example 16 | E | 30 | E | 30 | E |
| Comparative Example 17 | D | 35 | D | 35 | D |
| Comparative Example 18 | E | 25 | E | 25 | E |
| Comparative Example 19 | D | 40 | D | 40 | D |

TABLE 1-3-2

| | Polyester film Durability | | Backsheet Durability | | Solar cell panel Durability |
|---|---|---|---|---|---|
| Comparative Example 20 | E | 30 | E | 30 | E |
| Comparative Example 21 | E | 25 | E | 25 | E |
| Comparative Example 22 | D | 40 | D | 40 | D |
| Comparative Example 23 | D | 35 | D | 35 | D |
| Comparative Example 24 | E | 25 | E | 25 | E |
| Comparative Example 25 | E | 30 | E | 30 | E |
| Comparative Example 26 | D | 35 | D | 35 | D |
| Comparative Example 27 | E | 25 | E | 25 | E |

TABLE 1-3-1

| | Polyester | Additive | Particle size [μm] | Concentration [% by mass] | Processing method | COOH [eq/t] | SPc_L [number] | SPc_H [number] | Domain size [nm] |
|---|---|---|---|---|---|---|---|---|---|
| Comparative Example 20 | PET | | | | Imprint 4 | 15 | 90 | 0 | |
| Comparative Example 21 | PET | | | | Imprint 4 | 25 | 90 | 0 | |
| Comparative Example 22 | PET | | | | Imprint 5 | 0 | 500 | 11 | |
| Comparative Example 23 | PET | | | | Imprint 5 | 15 | 500 | 11 | |
| Comparative Example 24 | PET | | | | Imprint 5 | 25 | 500 | 11 | |
| Comparative Example 25 | PET | | | | Imprint 1 | 26 | 100 | 0 | |
| Comparative Example 26 | PET | | | | Imprint 2 | 26 | 250 | 0 | |
| Comparative Example 27 | PET | | | | Imprint 3 | 26 | 500 | 10 | |

TABLE 2-1

|  | Polyester | Additive | Particle size [μm] | Concentration [% by mass] | Processing method | COOH [eq/t] | SPc_L [number] | SPc_H [number] | Domain size [nm] |
|---|---|---|---|---|---|---|---|---|---|
| Example 28 | PET | silica | 2 | 5 |  | 15 | 600 | 5 |  |
| Example 29 | PET | silica | 2 | 6 |  | 15 | 700 | 7 |  |
| Example 30 | PET | silica | 10 | 0.1 |  | 15 | 100 | 4 |  |
| Example 31 | PET | silica | 10 | 5 |  | 15 | 100 | 10 |  |
| Example 32 | PET | BaSO4 | 4 | 0.5 |  | 15 | 250 | 0 |  |
| Example 33 | PET | Ca carbonate | 4 | 0.5 |  | 15 | 250 | 0 |  |
| Example 34 | PET | PCHT |  | 5 |  | 15 | 120 | 0 | 400 |
| Example 35 | PET | PCHT |  | 5 |  | 15 | 150 | 0 | 500 |
| Example 36 | PET | PCHT |  | 5 |  | 15 | 180 | 1 | 3,000 |
| Example 37 | PET | PCHT |  | 5 |  | 15 | 150 | 2 | 3,100 |
| Example 38 | PET | PCHT |  | 10 |  | 15 | 500 | 0 | 500 |
| Example 39 | PET | ABS |  | 5 |  | 15 | 250 | 0 | 1,000 |
| Example 40 | PET | PC |  | 5 |  | 15 | 200 | 0 | 2,000 |
| Example 41 | PET | PEI |  | 5 |  | 15 | 150 | 0 | 500 |
| Comparative Example 28 | PET | silica | 2 | 0.05 |  | 15 | 90 | 0 |  |
| Comparative Example 29 | PET | silica | 10 | 0.05 |  | 15 | 50 | 3 |  |
| Comparative Example 30 | PET | silica | 10 | 6 |  | 15 | 100 | 11 |  |

TABLE 2-2

|  | Polyester film Durability |  | Backsheet Durability |  | Solar cell panel Durability |
|---|---|---|---|---|---|
| Example 28 | B | 60 | B | 60 | B |
| Example 29 | C | 50 | C | 50 | C |
| Example 30 | C | 45 | C | 45 | C |
| Example 31 | C | 45 | C | 45 | C |
| Example 32 | A | 70 | A | 70 | A |
| Example 33 | A | 70 | A | 70 | A |
| Example 34 | B | 55 | B | 55 | B |
| Example 35 | A | 65 | A | 65 | A |
| Example 36 | A | 65 | A | 65 | A |
| Example 37 | B | 55 | B | 55 | B |
| Example 38 | A | 75 | A | 75 | A |
| Example 39 | A | 70 | A | 70 | A |
| Example 40 | A | 65 | A | 65 | A |
| Example 41 | B | 55 | B | 55 | B |
| Comparative Example 28 | E | 30 | E | 30 | E |
| Comparative Example 29 | E | 25 | E | 25 | E |
| Comparative Example 30 | E | 30 | E | 30 | E |

TABLE 3-1

|  | Stretching roll |  | Nip roll |  |  | Preheating |  |  |  |
|---|---|---|---|---|---|---|---|---|---|
|  | Material | Surface hardness [°] | Material | Surface hardness [°] | Nip pressure [MPa] | zone Air flow rate [m/s] | Cooling zone Air flow rate [m/s] | SPc_L [number] | SPc_H [number] |
| Example 5 | silicon | 40 | silicon | 40 | 0.1 | 3 | 20 | 250 | 0 |
| Example 42 | silicon | 45 | silicon | 40 | 0.1 | 3 | 20 | 200 | 0 |
| Example 43 | silicon | 40 | silicon | 45 | 0.1 | 3 | 20 | 200 | 0 |
| Example 44 | silicon | 40 | silicon | 40 | 0.1 | 5 | 20 | 200 | 0 |
| Example 45 | silicon | 40 | silicon | 40 | 0.1 | 3 | 15 | 200 | 0 |
| Example 46 | silicon | 46 | silicon | 40 | 0.1 | 3 | 20 | 150 | 0 |
| Example 47 | silicon | 40 | silicon | 46 | 0.1 | 3 | 20 | 150 | 0 |
| Example 48 | silicon | 40 | silicon | 40 | 0.1 | 6 | 20 | 150 | 0 |
| Example 49 | silicon | 40 | silicon | 40 | 0.1 | 3 | 14 | 150 | 0 |
| Example 14 | silicon | 40 | silicon | 40 | 0.1 | 3 | 20 | 250 | 0 |
| Example 50 | silicon | 45 | silicon | 40 | 0.1 | 3 | 20 | 200 | 0 |
| Example 51 | silicon | 40 | silicon | 45 | 0.1 | 3 | 20 | 200 | 0 |
| Example 52 | silicon | 40 | silicon | 40 | 0.1 | 5 | 20 | 200 | 0 |
| Example 53 | silicon | 40 | silicon | 40 | 0.1 | 3 | 15 | 200 | 0 |
| Example 54 | silicon | 46 | silicon | 40 | 0.1 | 3 | 20 | 150 | 0 |
| Example 55 | silicon | 40 | silicon | 46 | 0.1 | 3 | 20 | 150 | 0 |
| Example 56 | silicon | 40 | silicon | 40 | 0.1 | 6 | 20 | 150 | 0 |
| Example 57 | silicon | 40 | silicon | 40 | 0.1 | 3 | 14 | 150 | 0 |
| Comparative Example 31 | ceramic | 80 | silicon | 40 | 0.1 | 3 | 20 | 50 | 0 |
| Comparative Example 32 | silicon | 40 | silicon | 40 | 0.2 | 3 | 20 | 70 | 0 |
| Comparative Example 33 | ceramic | 80 | silicon | 40 | 0.1 | 3 | 20 | 50 | 0 |
| Comparative Example 34 | silicon | 40 | silicon | 40 | 0.2 | 3 | 20 | 70 | 0 |

TABLE 3-2

|  | Polyester film Durability | | Backsheet Durability | | Solar cell panel Durability |
| --- | --- | --- | --- | --- | --- |
| Example 5 | A | 70 | A | 70 | A |
| Example 42 | A | 65 | A | 65 | A |
| Example 43 | A | 65 | A | 65 | A |
| Example 44 | A | 65 | A | 65 | A |
| Example 45 | A | 65 | A | 65 | A |
| Example 46 | B | 60 | B | 60 | B |
| Example 47 | B | 60 | B | 60 | B |
| Example 48 | B | 60 | B | 60 | B |
| Example 49 | B | 60 | B | 60 | B |
| Example 14 | A | 70 | A | 70 | A |
| Example 50 | A | 65 | A | 65 | A |
| Example 51 | A | 65 | A | 65 | A |
| Example 52 | A | 65 | A | 65 | A |
| Example 53 | A | 65 | A | 65 | A |
| Example 54 | B | 60 | B | 60 | B |
| Example 55 | B | 60 | B | 60 | B |
| Example 56 | B | 60 | B | 60 | B |
| Example 57 | B | 60 | B | 60 | B |
| Comparative Example 31 | E | 25 | E | 25 | E |
| Comparative Example 32 | E | 30 | E | 30 | E |
| Comparative Example 33 | E | 25 | E | 25 | E |
| Comparative Example 34 | E | 30 | E | 30 | E |

TABLE 4-1-2

|  | Polyester film Durability | | Backsheet Durability | | Solar cell panel Durability |
| --- | --- | --- | --- | --- | --- |
| Example 58 | A | 65 | A | 65 | A |
| Example 59 | B | 55 | B | 55 | B |
| Example 60 | C | 45 | C | 45 | C |
| Example 61 | A | 90 | A | 90 | A |
| Example 62 | A | 70 | A | 70 | A |
| Example 63 | B | 60 | B | 60 | B |
| Example 64 | A | 65 | A | 65 | A |
| Example 65 | B | 55 | B | 55 | B |
| Example 66 | C | 45 | C | 45 | C |
| Example 67 | A | 65 | A | 65 | A |
| Example 68 | B | 55 | B | 55 | B |
| Example 69 | C | 45 | C | 45 | C |
| Example 70 | A | 90 | A | 90 | A |
| Example 71 | A | 70 | A | 70 | A |
| Example 72 | B | 60 | B | 60 | B |
| Example 73 | A | 65 | A | 65 | A |
| Example 74 | B | 55 | B | 55 | B |
| Example 75 | C | 45 | C | 45 | C |

TABLE 4-1-1

|  | Layer A | | | | Layer B | | | | Surface A | | Domain |
| --- | --- | --- | --- | --- | --- | --- | --- | --- | --- | --- | --- |
|  | Polyester | Additive | Particle size [μm] | Concentration [% by mass] | Polyester | Additive | Particle size [μm] | Concentration [% by mass] | COOH [eq/t] | SPc_L [number] | SPc_H [number] | size [nm] |
| Example 58 | PET | silica | 2 | 0.1 | PET |  |  |  | 0 | 100 | 0 |  |
| Example 59 | PET | silica | 2 | 0.1 | PET |  |  |  | 15 | 100 | 0 |  |
| Example 60 | PET | silica | 2 | 0.1 | PET |  |  |  | 25 | 100 | 0 |  |
| Example 61 | PET | silica | 4 | 0.5 | PET |  |  |  | 0 | 250 | 0 |  |
| Example 62 | PET | silica | 4 | 0.5 | PET |  |  |  | 15 | 250 | 0 |  |
| Example 63 | PET | silica | 4 | 0.5 | PET |  |  |  | 25 | 250 | 0 |  |
| Example 64 | PET | silica | 4 | 5 | PET |  |  |  | 0 | 500 | 10 |  |
| Example 65 | PET | silica | 4 | 5 | PET |  |  |  | 15 | 500 | 10 |  |
| Example 66 | PET | silica | 4 | 5 | PET |  |  |  | 25 | 500 | 10 |  |
| Example 67 | PET | PCHT |  | 2 | PET |  |  |  | 0 | 100 | 0 | 1,000 |
| Example 68 | PET | PCHT |  | 2 | PET |  |  |  | 15 | 100 | 0 | 1,000 |
| Example 69 | PET | PCHT |  | 2 | PET |  |  |  | 25 | 100 | 0 | 1,000 |
| Example 70 | PET | PCHT |  | 5 | PET |  |  |  | 0 | 250 | 0 | 1,000 |
| Example 71 | PET | PCHT |  | 5 | PET |  |  |  | 15 | 250 | 0 | 1,000 |
| Example 72 | PET | PCHT |  | 5 | PET |  |  |  | 25 | 250 | 0 | 1,000 |
| Example 73 | PET | PCHT |  | 10 | PET |  |  |  | 0 | 500 | 10 | 1,000 |
| Example 74 | PET | PCHT |  | 10 | PET |  |  |  | 15 | 500 | 10 | 1,000 |
| Example 75 | PET | PCHT |  | 10 | PET |  |  |  | 25 | 500 | 10 | 1,000 |

TABLE 4-2-1

| | Layer A | | | | Layer B | | | | | Surface A | | Domain |
| --- | --- | --- | --- | --- | --- | --- | --- | --- | --- | --- | --- | --- |
| | Poly-ester | Additive | Particle size [μm] | Con-centration [% by mass] | Poly-ester | Addi-tive | Particle size [μm] | Con-centration [% by mass] | COOH [eq/t] | SPc_L [number] | SPc_H [number] | size [nm] |
| Comparative Example 35 | PET | silica | 1.5 | 1 | PET | | | | 0 | 90 | 0 | |
| Comparative Example 36 | PET | silica | 1.5 | 1 | PET | | | | 15 | 90 | 0 | |
| Comparative Example 37 | PET | silica | 1.5 | 1 | PET | | | | 25 | 90 | 0 | |
| Comparative Example 38 | PET | silica | 4 | 6 | PET | | | | 0 | 500 | 11 | |
| Comparative Example 39 | PET | silica | 4 | 6 | PET | | | | 15 | 500 | 11 | |
| Comparative Example 40 | PET | silica | 4 | 6 | PET | | | | 25 | 500 | 11 | |
| Comparative Example 41 | PET | silica | 4 | 0.1 | PET | | | | 26 | 100 | 0 | |
| Comparative Example 42 | PET | silica | 4 | 0.5 | PET | | | | 26 | 250 | 0 | |
| Comparative Example 43 | PET | silica | 4 | 5 | PET | | | | 26 | 500 | 10 | |
| Comparative Example 44 | PET | PCHT | | 1 | PET | | | | 0 | 90 | 0 | 1,000 |
| Comparative Example 45 | PET | PCHT | | 1 | PET | | | | 15 | 90 | 0 | 1,000 |
| Comparative Example 46 | PET | PCHT | | 1 | PET | | | | 25 | 90 | 0 | 1,000 |
| Comparative Example 47 | PET | PCHT | | 15 | PET | | | | 0 | 500 | 11 | 1,000 |
| Comparative Example 48 | PET | PCHT | | 15 | PET | | | | 15 | 500 | 11 | 1,000 |
| Comparative Example 49 | PET | PCHT | | 15 | PET | | | | 25 | 500 | 11 | 1,000 |
| Comparative Example 50 | PET | PCHT | | 2 | PET | | | | 26 | 100 | 0 | 1,000 |
| Comparative Example 51 | PET | PCHT | | 5 | PET | | | | 26 | 250 | 0 | 1,000 |
| Comparative Example 52 | PET | PCHT | | 15 | PET | | | | 26 | 500 | 10 | 1,000 |

TABLE 4-2-2

| | Polyester film Durability | | Backsheet Durability | | Solar cell panel Durability |
| --- | --- | --- | --- | --- | --- |
| Comparative Example 35 | D | 40 | D | 40 | D |
| Comparative Example 36 | E | 30 | E | 30 | E |
| Comparative Example 37 | E | 25 | E | 25 | E |
| Comparative Example 38 | D | 40 | D | 40 | D |
| Comparative Example 39 | D | 35 | D | 35 | D |
| Comparative Example 40 | E | 25 | E | 25 | E |
| Comparative Example 41 | E | 30 | E | 30 | E |
| Comparative Example 42 | D | 35 | D | 35 | D |
| Comparative Example 43 | E | 25 | E | 25 | E |
| Comparative Example 44 | D | 40 | D | 40 | D |
| Comparative Example 45 | E | 30 | E | 30 | E |
| Comparative Example 46 | E | 25 | E | 25 | E |
| Comparative Example 47 | D | 40 | D | 40 | D |
| Comparative Example 48 | D | 35 | D | 35 | D |
| Comparative Example 49 | E | 25 | E | 25 | E |
| Comparative Example 50 | E | 30 | E | 30 | E |
| Comparative Example 51 | D | 35 | D | 35 | D |
| Comparative Example 52 | E | 25 | E | 25 | E |

TABLE 5-2

| | Polyester film Durability | | Backsheet Durability | | Solar cell panel Durability |
| --- | --- | --- | --- | --- | --- |
| Example 5 | A | 70 | A | 70 | A |
| Example 76 | A | 65 | A | 65 | A |
| Example 77 | B | 60 | B | 60 | B |
| Comparative Example 53 | E | 25 | E | 25 | E |
| Comparative Example 54 | E | 25 | E | 25 | E |
| Comparative Example 55 | E | 25 | E | 25 | E |
| Example 14 | A | 70 | A | 70 | A |
| Example 78 | A | 65 | A | 65 | A |
| Example 79 | B | 60 | B | 60 | B |
| Comparative Example 56 | E | 25 | E | 25 | E |
| Comparative Example 57 | E | 25 | E | 25 | E |
| Comparative Example 58 | E | 25 | E | 25 | E |

TABLE 5-1

| | Stretching roll | | Nip roll | | | Preheating | | | |
| --- | --- | --- | --- | --- | --- | --- | --- | --- | --- |
| | Material | Surface hardness [°] | Material | Surface hardness [°] | Nip pressure [MPa] | zone Air flow rate [m/s] | Cooling zone Air flow rate [m/s] | SPc_L [number] | SPc_H [number] |
| Example 5 | silicon | 40 | silicon | 40 | 0.1 | 3 | 20 | 250 | 0 |
| Example 76 | silicon | 40 | silicon | 40 | 0.15 | 3 | 20 | 200 | 0 |
| Example 77 | silicon | 40 | silicon | 40 | 0.16 | 3 | 20 | 150 | 0 |
| Comparative Example 53 | silicon | 40 | silicon | 70 | 0.1 | 3 | 20 | 50 | 0 |
| Comparative Example 54 | silicon | 40 | silicon | 40 | 0.1 | 20 | 20 | 50 | 0 |
| Comparative Example 55 | silicon | 40 | silicon | 40 | 0.1 | 3 | 3 | 50 | 0 |
| Example 14 | silicon | 40 | silicon | 40 | 0.1 | 3 | 20 | 250 | 0 |
| Example 78 | silicon | 40 | silicon | 40 | 0.15 | 3 | 20 | 200 | 0 |
| Example 79 | silicon | 40 | silicon | 40 | 0.16 | 3 | 20 | 150 | 0 |
| Comparative Example 56 | silicon | 40 | silicon | 70 | 0.1 | 3 | 20 | 50 | 0 |
| Comparative Example 57 | silicon | 40 | silicon | 40 | 0.1 | 20 | 20 | 50 | 0 |
| Comparative Example 58 | silicon | 40 | silicon | 40 | 0.1 | 3 | 3 | 50 | 0 |

TABLE 6-1

|  | Polyester | Additive | Particle size [μm] | Concentration [% by mass] | COOH [eq/t] | SPc_L [number] | SPc_H [number] |
|---|---|---|---|---|---|---|---|
| Example 80 | PET | Aluminosilicate | 2 | 0.1 | 0 | 100 | 0 |
| Example 81 | PET | Aluminosilicate | 2 | 0.1 | 13 | 100 | 0 |
| Example 82 | PET | Aluminosilicate | 2 | 0.1 | 23 | 100 | 0 |
| Example 83 | PET | Aluminosilicate | 4 | 0.5 | 0 | 250 | 0 |
| Example 84 | PET | Aluminosilicate | 4 | 0.5 | 13 | 250 | 0 |
| Example 85 | PET | Aluminosilicate | 4 | 0.5 | 23 | 250 | 0 |
| Example 86 | PET | Aluminosilicate | 4 | 5 | 0 | 500 | 10 |
| Example 87 | PET | Aluminosilicate | 4 | 5 | 13 | 500 | 10 |
| Example 88 | PET | Aluminosilicate | 4 | 5 | 23 | 500 | 10 |

TABLE 6-2

|  | Polyester film Durability | | Backsheet Durability | | Solar cell panel Durability |
|---|---|---|---|---|---|
| Example 80 | A | 75 | A | 65 | A |
| Example 81 | A | 65 | A | 55 | A |
| Example 82 | B | 55 | B | 45 | B |
| Example 83 | A | 100 | A | 90 | A |
| Example 84 | A | 80 | A | 70 | A |
| Example 85 | A | 70 | A | 60 | A |
| Example 86 | A | 75 | A | 65 | A |
| Example 87 | A | 65 | A | 55 | A |
| Example 88 | B | 55 | B | 45 | B |

The symbols used in the tables above have the following meanings.
COOH: amount of terminal carboxyl groups
PCHT: cyclohexadimethyl ether
ABS: acryl butadiene styrene resin
PC: polycarbonate resin
PEI: polyetherimide resin
PET: polyethylene terephthalate
BaSO$_4$: barium sulfate
Ca carbonate: calcium carbonate

INDUSTRIAL APPLICABILITY

According to the present invention, a polyester film having excellent wet heat resistance can be provided. The polyester film, by taking advantage of its characteristic features, can be suitably used as a film for a solar cell backsheet.

The invention claimed is:

1. A solar cell which comprises a solar cell backsheet comprising a polyester film, having a peak count SPc_L (400 nm) of 100 to 700 and a peak count SPc_H (4,000 nm) of not more than 10 on at least one surface,
   said polyester film having terminal carboxyl groups in an amount of zero to 20 eq/ton.

2. The solar cell according to claim 1,
   wherein said polyester film comprises a layer containing particles of 2 μm or larger in size as the outermost layer, and
   wherein the content of said particles is 0.1 to 5% by mass with respect to the amount of polyester in said layer containing particles of 2 μm or larger in size.

3. The solar cell according to claim 2, wherein said particles are aluminosilicate particles.

4. The solar cell according to claim 1, wherein said polyester film comprises a layer containing a resin of 500 to 3,000 nm in domain size as the outermost layer.

5. The solar cell according to claim 1, wherein said polyester film has terminal carboxyl groups in an amount of zero to 15 eq/ton.

* * * * *